United States Patent [19]

Widmann et al.

[11] 4,090,068
[45] May 16, 1978

[54] PROCESS FOR THE AUTOMATIC ADJUSTMENT OF SEMICONDUCTOR WAFERS

[75] Inventors: Dietrich Widmann, Unterhaching; Johann Binder, Unterpfaffenhofen, both of Germany

[73] Assignee: Siemens Aktiengesellschaft, Berlin & Munich, Germany

[21] Appl. No.: 709,129

[22] Filed: Jul. 26, 1976

[30] Foreign Application Priority Data

Sep. 3, 1975 Germany .............................. 2539206

[51] Int. Cl.² ............................................ G01J 1/20
[52] U.S. Cl. ..................................... 250/201; 356/152
[58] Field of Search ................ 356/152, 172; 318/640; 250/201, 237, 548

[56] References Cited

U.S. PATENT DOCUMENTS

| 3,885,877 | 5/1975 | Horwath | 356/152 |
| 3,943,359 | 3/1976 | Keiichi | 356/152 |

*Primary Examiner*—Rudolph V. Rolinec
*Assistant Examiner*—Michael J. Tokar
*Attorney, Agent, or Firm*—Hill, Gross, Simpson, Van Santen, Steadman, Chiara & Simpson

[57] ABSTRACT

In a method for the automatic adjustment of semiconductor wafers, adjustment marks are arranged on the surface of the wafer to be adjusted. Light is emitted through a transparent body with an attached mask. The transparent body and mask are displaced so that adjustment patterns on the mask are aligned with respect to the wafer adjustment patterns. A shutter below the mask ensures that only light beams which pass through the adjustment patterns of the mask hit the surface of the semiconductor wafer. Light beams passing through the adjustment patterns of the mask are directed onto the surface of the semiconductor wafer by an objective. The wafer reflects the light back through the objective, shutter apertures and adjustment patterns. The reflected back beams of light are detected by light sensitive elements and the orientation of the mask and transparent body is arranged such that minimum reflected light is received at the light sensitive elements.

10 Claims, 15 Drawing Figures

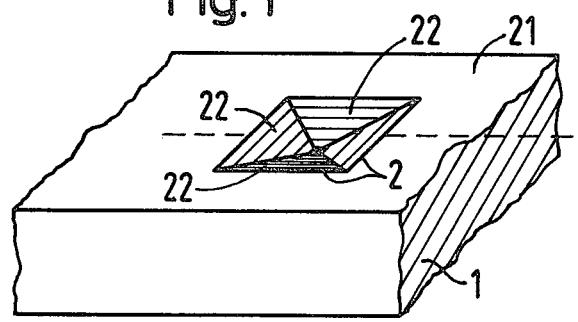
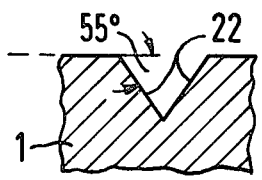
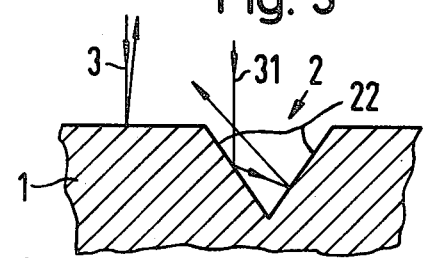
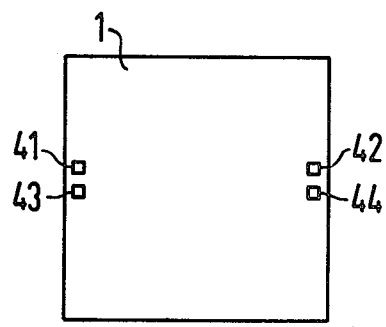
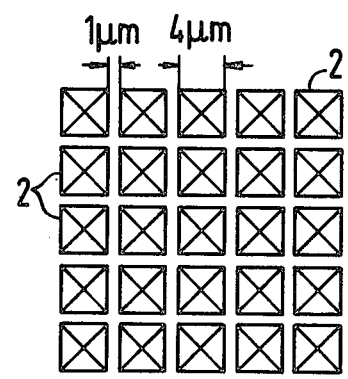
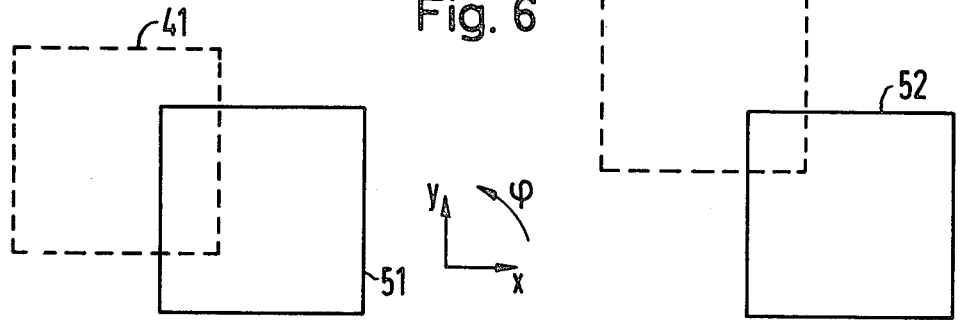

PROCESS FOR THE AUTOMATIC ADJUSTMENT OF SEMICONDUCTOR WAFERS

BACKGROUND OF THE INVENTION

1. Field of the Invention

The invention relates to a process for the automatic adjustment of layered substrates, and more particularly the adjustment of semiconductor wafers by use of adjustment marks with optical alignment techniques.

2. Description of the Prior Art

It is known to produce structures in semiconductor surfaces by selective exposure and subsequent development of a photo resist layer arranged on the semiconductor surface. In a further process step, the zones of the surface layer to be structured and which are not covered with photo resist are etched away from the semiconductor surface. The photo resist layer is exposed at the zones either by means of contact printing or by means of projection printing. Contact printing is here defined as pressing a photo mask and the coated semiconductor wafer against one another. In projection printing, a 1:1 copy or a 1:10 reduction copy is produced by use of a high-resolution objective. Projection printing with 1:10 reduction possesses decided advantages, such as, for example, a high resolution of 500 lines/mm and a high adjustment accuracy of $\pm 0.2$ $\mu$m. Due to the lack of mechanical stress on mask and semiconductor wafer, it is possible to achieve defect free copies. A further advantage is the reduced testing expenses for mask control. Also the expansions or deflections of the semiconductor wafer have only a negligible influence on the alignment accuracy for consecutive structure planes. A disadvantage of this projection technique, however, is that the exposure of the entire semiconductor surface (e.g. 50 mm diameter) is very expensive since a plurality of adjusting and exposure steps are required.

SUMMARY OF THE INVENTION

Accordingly, an object of the present invention is to provide an economical process which facilitates automatic adjustment and exposure.

According to the invention, at least four adjustment patterns are arranged on the surface of a substrate such as a semiconductor wafer. Each of the adjustment patterns has a plurality of recesses. Convergent light is emitted from a condenser through a transparent body onto an applied mask to be adjusted. Adjustment patterns are provided on the mask. A shutter having apertures at positions corresponding to the adjustment patterns of the mask to ensure that only light beams which pass through the adjustment patterns of the mask hit the surface of the substrate. The light beams which pass through the adjustment patterns of the mask are projected with an objective so that they hit the surface of the substrate and are reflected back through the objective, shutter apertures and adjustment patterns. Light beams which hit adjustment pattern recesses on the substrate are not reflected. The reflected back beams are deflected onto light sensitive elements which emit signals to control motors. The control motors translate the transparent body and attached mask in the $x$ and $y$ directions of a coordinate system. The motors also rotate the transparent body by an angle $\phi$ within the coordinate system to align the adjustment patterns of the mask with respect to the adjustment patterns on the substrate so that a minimum of light intensity is received by the light sensitive elements.

The adjustment process of the invention is also suitable for automatic adjustment in contact or proximity printing.

With the process of the invention it is possible to compensate for slight changes in the adjustment structure such as occurs, for example, during high temperature processes in an oxidizing atmosphere. This change occurs since silicon is converted into $SiO_2$ in the region of the adjustment structure so that the reflecting Si/Si-$O_2$ boundary is displaced somewhat into the semiconductor crystal.

BRIEF DESCRIPTION OF THE DRAWINGS

FIG. 1 schematically illustrates the formation of pyramid shaped recesses as a result of anisotropic etching;

FIG. 2 is a sectional view through the pyramid shaped recess of FIG. 1;

FIG. 3 shows the behavior of light projected by an objective onto the wafer surface and into the pyramid shaped recess;

FIG. 4 shows a plan view of a semiconductor wafer with adjustment patterns of the invention;

FIG. 5 illustrates an enlarged, schematic view of one of the adjustment patterns shown in FIG. 4;

FIGS. 6 to 8 schematically illustrate individual commands for automatic adjustment;

DESCRIPTION OF THE PREFERRED EMBODIMENTS

Figure 7:
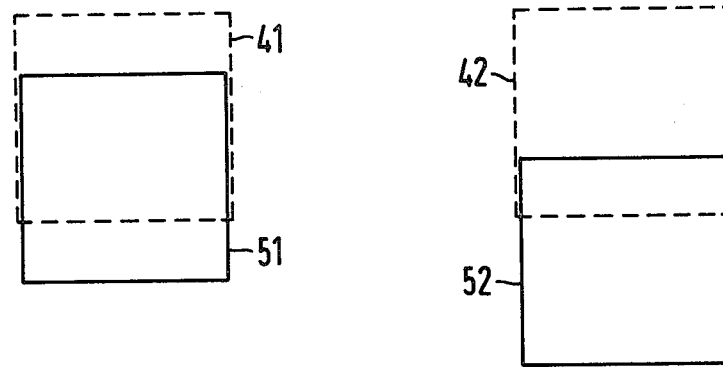

In FIG. 1 the semiconductor wafer is illustrated at 1. For the production of adjustment patterns, etching structures are employed which are formed during anisotropic etching of monocrystalline silicon in alkaline etching solution. In FIG. 1 such a pyramid shaped etched structure and recess is illustrated at 2. The recess 2, which is formed by anisotropic etching of the semiconductor substrate 1, having a crystallographic (100) surface is pyramid shaped and, as shown in FIG. 1, has four oblique (111) surfaces 22, which form the sides of the pyramid projecting into the semiconductor substrate 1.

FIG. 2 shows a section through such a pyramid shaped recess which has been produced by anisotropic etching. Here, an angle of approximately 55° exists between the (111) surface and the (100) surface of the semiconductor substrate 1.

If, as shown in FIG. 3, light is projected onto the surface of the semiconductor wafer 1 by means of an objective, light beams 3 which hit the (100) surface are reflected back into the objective. On the other hand, beams 31, which hit the oblique (111) surfaces of the recesses 2, are not reflected back into the objective having relative aperture of $\leq$ 1:1.4. These zones, therefore appear dark.

For the automatic adjustment of the invention, adjustment patterns 41 to 44 of FIG. 4 are prepared on the semiconductor wafer 1. Adjustment patterns 41 and 42 serve for rough adjustment. At appropriate positions the reticle or mask to be adjusted has transparent square apertures 51 and 52 which are the same size as the square surface of the adjustment patterns 41 and 42. The adjustment patterns 43 and 44 serve for fine adjustment and at corresponding positions, the reticle or mask has corresponding patterns 53 and 54 (in FIG. 14) which are light transmissive at those zones in which no reflection occurs from the wafer and are opaque in the other zones.

In FIG. 5 preferred dimensions of the adjustment pattern structures are given. The number of small recesses 2 which are provided for each adjustment pattern can, for example, range from $5 \times 5$ to $20 \times 20$. The coincident patterns 53 and 54 on the reticle or mask are opaque at zones which lie between the recesses 2.

Figure 8:
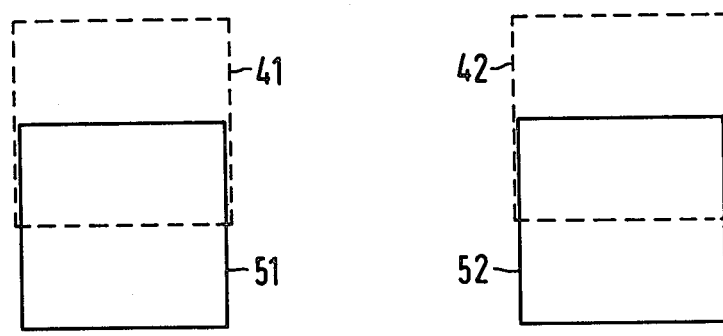

In the following the automatic adjustment process will be explained with reference to FIGS. 6 to 8. Here, it has been assumed that the wafer 1 can be positioned in relation to the reticle with sufficient accuracy for the corresponding adjustment patterns to overlap, as illustrated in FIG. 6. This can easily be effected by preliminary adjustment if the dimensions of the adjustment patterns are in the range from $50\mu m \times 50\mu m$ to $100\mu m \times 100\mu m$.

Figure 9:
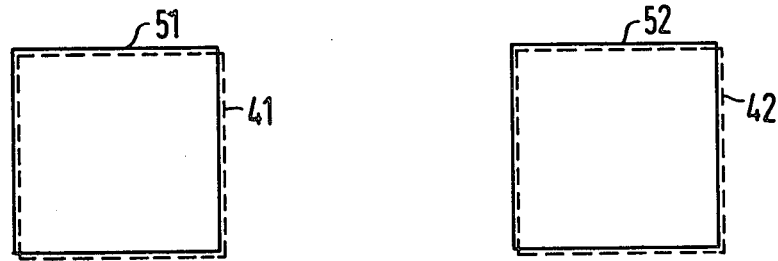
FIG. 9 schematically illustrates a plan view of an adjustment pattern in the adjusted state.

Automatic adjustment occurs as follows. As already described, a considerable misadjustment exists in the starting state. However, an overlap of the adjustment patterns of reticle and wafer exists. Thus, the adjustment patterns 41 of the semiconductor wafer and the adjustment aperture 51 of the reticle overlap. The adjustment patterns 42 of the semiconductor wafer and the adjustment aperture 52 of the reticle also overlap. The first command for automatic adjustment is as follows: "Displace the reticle in direction $x$ or $-x$ until the two photo-cells, each of which register the amount of light which is reflected by the wafer and which passes through the apertures 51 and 52, display a minimum. In other words, then as much light beams as is possible by an $x$ displacement is deflected by the patterns 41 and 42 so they are not received back at the apertures 51 and 52. The relative portion between the adjustment patterns 41 and 42 and the apertures 51 and 52 of the reticle shown in FIG. 7 then exists. The second command required for adjustment is as follows: "Rotate the reticle (angle $\phi$ in FIG. 6) until the two photo-cells display the same value". This state is attained when the number of light beams which pass through the aperture 51 of the reticle and hit the adjustment pattern 41 of the semiconductor wafer 1 is equal to the amount of light which passes through the aperture 52 of the reticle and hits the adjustment pattern 42 of the semiconductor wafer 1. Then the state illustrated in FIG. 8 exists. By use of a third command, the rough adjustment is completed. The accuracy of this rough adjustment amounts to $\pm 1\mu m$. The third command is: "Displace the reticle in direction $y$ or $-y$ until both photo cells display a minimum". This state is attained when, as illustrated in FIG. 9, the apertures 51 and 52 of the reticle coincide with the adjustment patterns 41 and 42 of the semiconductor wafer 1.

Figure 10:
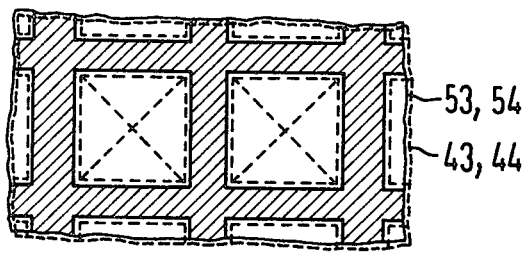
FIG. 10 is a segmental view illustrating alignment of the adjustment patterns of the mask with the adjustment pattern of the semiconductor wafer.

The same command sequence now follows for fine adjustment, in which the adjustment patterns 43 and 44 of the wafer and 53 and 54 of the reticle are adjusted in relation to one another. Here again adjustment is made to achieve an intensity minimum. If, during the $x-$ or $y-$ fine adjustment, the position of the reticle for the intensity minimum of the adjustment patterns 53 and 43 does not agree with the position for 54 and 44, a middle position between these two positions must be adopted. This compensates for a difference in the distance between the adjustment patterns 43–53, and 44–54. In the adjusted state, the mutual position illustrated in FIG. 10 then exists. Here, the shaded zones indicate the opaque zones on the reticle, the solid lines indicate the boundaries between the transparent and opaque zones on the reticle for adjustment patterns 53 and 54, and the broken lines indicate the edges of the recesses 2 of the adjustment patterns 43 and 44, on the chip surface.

Preferably the rough adjustment is carried out with green light which photo-chemically converts the photo resist only to a negligible extent. This ensures that the photo resist is photo-chemically converted only during the fine adjustment and only within the adjustment patterns.

Preferably the wave length which is used to produce the device pattern is also used for the fine adjustment, as it is only with this wave length that an optimum coincidence of the structures is achieved.

The above described adjustment structure in FIGS. 1 and 2 can be used only in silicon wafers having a crystallographic (100) surface. The adjustment structure proposed below is largely independent of wafer material and crystallographic orientation.

Figure 11:
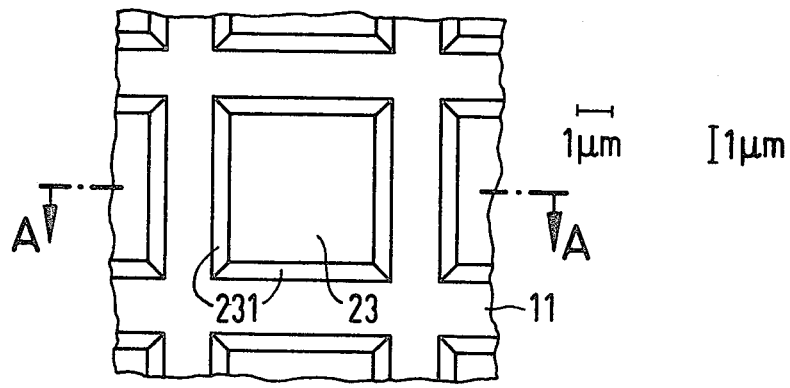
FIGS. 11 to 13 schematically illustrate the production of adjustment patterns in accordance with the invention.
Figure 12:
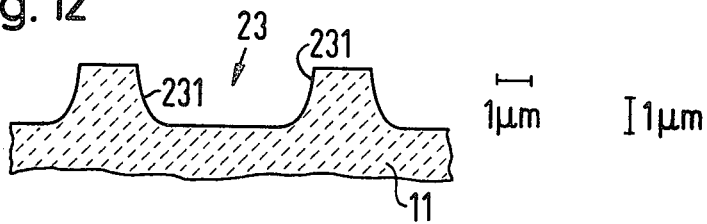
Figure 13:
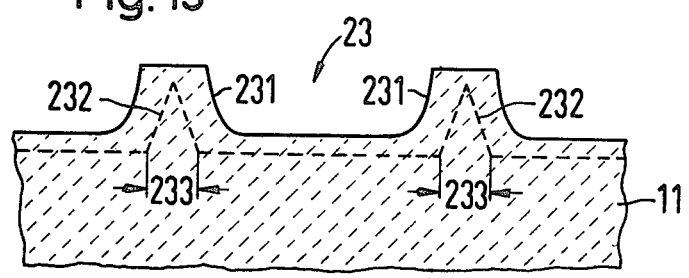

As illustrated in FIG. 11, for the adjustment structure shown there, holes 23 having a depth of $2\mu m$, for example, are etched into the substrate 11 by wet chemical etching or ion etching. The obliquely sloped surfaces of the crystallographic orientation (111) are marked 231. FIG. 12 shows the section A—A from FIG. 11. As in the case of wet-chemical etching, the course of the slope 231 is still fairly undefined at this stage. The substrate surface is bombarded with ions or atoms in order to bring the etching flanks into slopes with a clearly defined, uniform angle of slope. Here the substrate 11 is not covered by a masking layer. For silicon, however, the use of an $SiO_2$ layer on the silicon would not be disturbing. Then the structure illustrated in section in FIG. 13 is formed, which has slopes with a flank angle of approximately 65°. The production of such angles of slope has been described by A. D. G. Stewart and M. W. Thompson in "Journal of Materials Science" 4, p. 56 to 60 (1969). In FIG. 13 as in FIG. 12, the slopes existing prior to the ion etching are designated 231. The defined slopes which occur after the ion etching are referenced 232. As with the adjustment structure described in the introduction having the pyramid shaped recesses, with the adjustment structures shown in FIG. 13 light beams which fall inside the slope zones 233 are not reflected back into the objective so that the substrate surface appears dark in the region of the slopes.

If the associated reticle adjustment structure is designed to be light transmissive at the points corresponding to the slope zones 233 and is opaque in the other zones, a precise fine adjustment can be effected with the aid of photo-cells, through a minimum adjustment of the light intensity which hits them.

Figure 14:
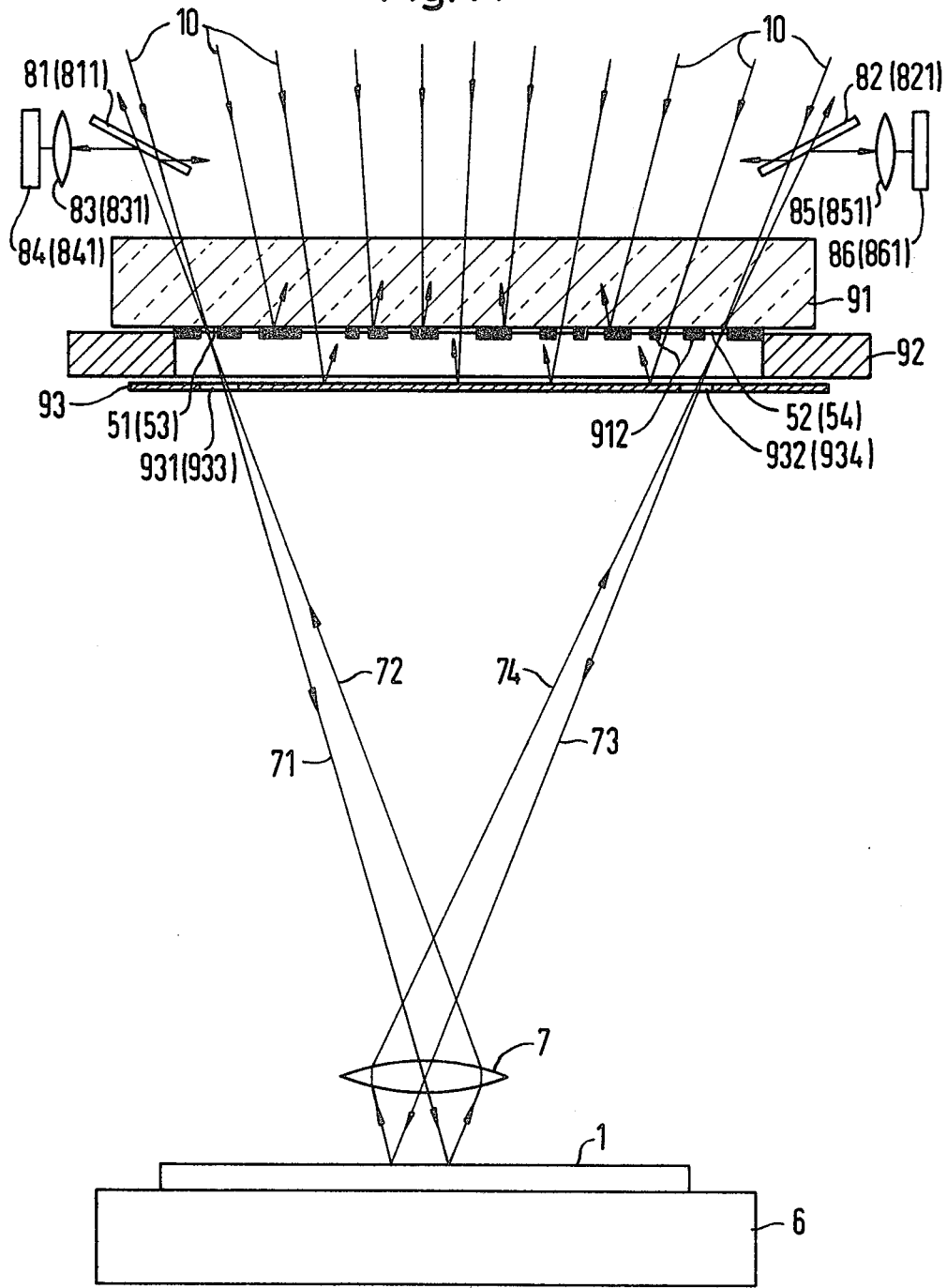
FIGS. 14 and 15 schematically illustrate an additional device for a commercially available step and repeat device.
Figure 15:
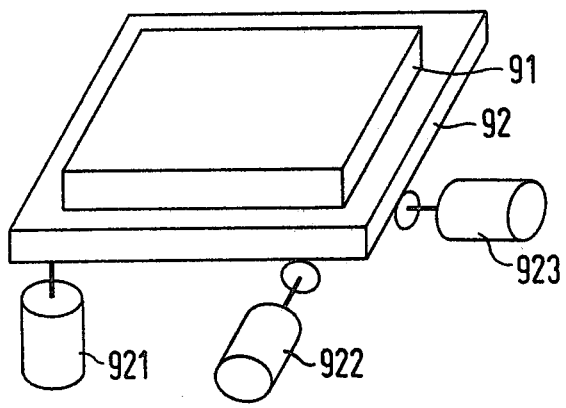

FIG. 14 illustrates a device for the performance of the process of the invention. Details of FIG. 14 which have already been described in association with the other Figures bear corresponding reference numerals. The table for the step and repeat device upon which the semiconductor wafer 1 is arranged is referenced 6. A table of this type is described in the publication D. S.

Alles et al. "The Step and Repeat Camera", The Bell System Techn. Journ, Vol. 49 Nov. 1970, No. 9, p. 2145 ... 2177. The objective 7 of the step and repeat device reduces by 1:10, for example. The reticle is referenced 91 and the reticle structures, the opaque zones on the reticle, are referenced 912. The table upon which the reticle rests and which is adjustable in the $x$, $y$ and $\phi$ direction is referenced 92. Arranged beneath the table is a pivotable shutter 93 having openings 931 and 932 through which the light beams 71, 73 passing through adjustment apertures 51, 52 of the reticle can be directed towards the objective 7. All the other light beams hit the pivotable shutter 93. The reticle is preferably illuminated with convergent light 10 which originates from a condenser and has a wavelength $\lambda = 436$ nm, for example. Light beams 71, 73 pass through the adjustment apertures 53, 54 and are projected by the objective 7 onto the semiconductor wafer 1 in the manner illustrated in the Figure. The light beams 72 or 74 projected back from the semiconductor wafer 1 and which pass through the screen openings 931, 932 and adjustment patterns 51, 52 onto the reticle 91, are partially deflected via the semi-transparent reflectors 81, 82 and finally hit the photo-cells 84, 86 via the lenses 83, 85. A corresponding arrangement, which for the sake of simplicity has not been illustrated in the Figure, is provided for the fine adjustment. For this purpose, the screen 93 is provided with corresponding openings 933, 934 and the reticle is provided with the above described adjustment patterns 53, 54. Also provided are another pair of reflectors 811 and 821, a pair of lenses 831, 851 and another pair of photo-cells 841, 861. The reference numerals for the elements provided for fine adjustment are given in round brackets after the reference numerals for rough adjustment.

In another embodiment of the invention, two photo-cells are provided on each side instead of the individual photo-cells 84, 86 and 841, 861. In such an embodiment when using adjusting motors, it is also possible to determine the direction of adjustment from the difference between the two photo-cell currents.

The shutter 93, which has openings 931, 932 etc. in alignment with the adjustment patterns, is opened after completion of adjustment in order to project the entire pattern of the reticle 91 onto the semiconductor wafer 1. The adjustment accuracy amounts to approximately ± 0.2 $\mu$m.

Finally, the semiconductor wafer is automatically moved on by one raster unit, so that the adjustment and exposure of the next chip can be effected in the same manner as described above.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A method for the automatic adjustment of layered substrates including semiconductor wafers comprising the steps of:
    (a) arranging at least four adjustment patterns on a surface of the substrate, each of the adjustment patterns having a plurality of adjustment recesses;
    (b) emitting convergent light from a condenser through a transparent body onto an applied mask to be adjusted, said mask having adjustment patterns;
    (c) providing a shutter having apertures at positions corresponding to said adjustment patterns to ensure that only light beams which pass through the adjustment patterns hit the surface of the substrate;
    (d) projecting light beams passing through the adjustment patterns with an objective so that said light beams hit the surface of the substrate and are reflected back through the objective, shutter apertures, and adjustment patterns, on the mask said light beams not being reflected when they hit said adjustment recesses on the substrate;
    (e) deflecting the reflected back beams onto light sensitive elements; and
    (f) controlling motors with the signals of said light sensitive elements to translate the transparent body with applied mask in the $x$ and $y$ directions of a coordinate system and to rotate the transparent body by an angle $\phi$ in said coordinate system to align the adjustment patterns of the mask with respect to the adjustment patterns on the substrate so that a minimum of light is received by said light sensitive elements.

2. The method of claim 1, characterized in that for rough adjustment, the transparent body is preliminarily aligned with sufficient accuracy to ensure that adjustment patterns of the mask on the transparent body partially overlap with course adjustment patterns arranged on the surface of the layered material, that the transparent body is displaced in the $x$ or in the $-x$ direction until two light sensitive elements which register the reflected light beams passing through course adjustment patterns indicate a minimum, that the transparent body is rotated until the two light sensitive elements display the same value, and that the transparent body is displaced in the $y$ or $-y$ direction until the two course light sensitive elements display a minimum.

3. The method of claim 1 characterized in that for a fine adjustment, fine adjustment patterns are provided on the mask and on the transparent body, said patterns having individual apertures at positions corresponding to recesses of fine adjustment patterns on the substrate, said patterns being opaque at areas located between the individual apertures, that the transparent body is displaced in the $x$ or $-x$ direction until two light sensitive elements register a minimum amount of light intensity reflected back by the substrate, that the transparent body is rotated until the two light sensitive elements exhibit the same value, and finally that the body is displaced in the $y$ or $-y$ direction until the two light sensitive elements display a minimum.

4. The method of claim 1, characterized in that for a rough adjustment, rough adjustment patterns are arranged on the mask on the transparent body, which patterns, due to the scale of reproduction of the objective, correspond to course adjustment marks of the substrate.

5. The method of claim 1, characterized in that a rough adjustment is effected with green light which photo-chemically converts photo resist on the substrate only to a negligible extent.

6. The method of claim 1, characterized in that the substrate comprises silicon wafers and the adjustment patterns on the substrate are produced by anisotropic etching pyramid shaped recesses on a (100) crystallographic surface of the semiconductor wafer.

7. The method of claim 1, characterized in that the adjustment pattern recesses are etched by wet chemical etching to have a depth of approximately 2 $\mu$m into the substrate, that to achieve clearly defined etching flanks, the recesses are bombarded with ions giving rise to slopes with a defined flank angle.

8. The method of claim 1, characterized in that the reflected back beams are deflected onto the light sensitive elements via semi-transparent, inclined reflectors and via lenses.

9. A method for the automatic adjustment of semiconductor wafers comprising the steps of:
   (a) arranging adjustment patterns on a surface of the semiconductor wafer;
   (b) emitting light through a transparent body with attached mask for adjustment thereof in relation to said semiconductor wafer, said mask having adjustment patterns;
   (c) displacing the transparent body with the mask arranged thereon so as to align the adjustment patterns on the mask with respect to the wafer adjustment patterns;
   (d) providing a shutter having apertures at positions corresponding to said adjustment patterns to ensure that only light beams which pass through the adjustment patterns on the mask hit the surface of the semiconductor wafer;
   (e) directing light beams passing through the adjustment patterns of the mask onto the surface of the semiconductor wafer so that they are reflected back through the shutter apertures and adjustment patterns of the mask;
   (f) deflecting the reflected back beams onto light sensitive elements; and
   (g) controlling the orientation of said mask and transparent body in a planar coordinate system with signals from said light sensitive elements, said transparent body being translated for minimum reflected light received at said light sensitive elements.

10. The method of claim 9 wherein the transparent body is also rotated in said planar coordinate system to receive approximately equal amounts of light from two different light sensitive elements.

* * * * *